(12) United States Patent
Kojima et al.

(10) Patent No.: US 12,733,425 B2
(45) Date of Patent: Sep. 8, 2026

(54) MEMBER FOR SEMICONDUCTOR MANUFACTURING APPARATUS

(71) Applicant: NGK Insulators, Ltd., Nagoya-City (JP)

(72) Inventors: Mitsuru Kojima, Handa-City (JP); Hiroshi Takebayashi, Handa-City (JP); Jyunya Waki, Handa-City (JP)

(73) Assignee: NGK INSULATORS, LTD., Nagoya-City (JP)

( * ) Notice: Subject to any disclaimer, the term of this patent is extended or adjusted under 35 U.S.C. 154(b) by 601 days.

(21) Appl. No.: 18/180,919

(22) Filed: Mar. 9, 2023

(65) Prior Publication Data

US 2024/0006194 A1 Jan. 4, 2024

Related U.S. Application Data

(63) Continuation of application No. PCT/JP2022/026286, filed on Jun. 30, 2022.

(51) Int. Cl.
*H10P 72/00* (2026.01)
*H10P 72/76* (2026.01)

(52) U.S. Cl.
CPC ...... *H10P 72/0402* (2026.01); *H10P 72/7616* (2026.01); *H10P 72/7624* (2026.01)

(58) Field of Classification Search
CPC ......... H01L 21/67017; H01L 21/68757; H01L 21/68785
USPC .......................................................... 118/728
See application file for complete search history.

(56) References Cited

U.S. PATENT DOCUMENTS

2010/0177454 A1* 7/2010 Elliot ................ H01L 21/67109 361/234
2019/0198299 A1 6/2019 Watanabe et al.
2020/0090959 A1 3/2020 Takebayashi
2020/0105568 A1 4/2020 Pilgrim
(Continued)

FOREIGN PATENT DOCUMENTS

JP 2009-070836 A 4/2009
JP 2017-123396 A 7/2017
(Continued)

OTHER PUBLICATIONS

International Search Report and Written Opinion (Application No. PCT/JP2022/026286) dated Aug. 9, 2022.
(Continued)

*Primary Examiner* — Charlee J. C. Bennett
(74) *Attorney, Agent, or Firm* — Muncy, Geissler, Olds & Lowe, P.C.

(57) ABSTRACT

A member for semiconductor manufacturing apparatus includes: a ceramic plate having a wafer placement surface; a conductive base plate; a gas common passage provided inside the base plate; gas outlet passages provided to reach the wafer placement surface from the gas common passage; at least one gas inlet passage provided to communicate with the gas common passage from a lower surface of the base plate; and an insulating sleeve disposed in a base plate through-hole. The insulating sleeve has a first communication hole that constitutes part of the gas common passage, and a second communication hole that is provided to reach an upper surface of the insulating sleeve from the first communication hole, and constitute part of the gas outlet passages.

6 Claims, 10 Drawing Sheets

(56) References Cited

U.S. PATENT DOCUMENTS

| | | | | |
|---|---|---|---|---|
| 2020/0227291 | A1* | 7/2020 | Ishikawa | H01J 37/32697 |
| 2020/0286755 | A1* | 9/2020 | Ito | H10P 72/72 |
| 2021/0391204 | A1* | 12/2021 | Furukawa | H01J 37/32733 |
| 2022/0013328 | A1* | 1/2022 | Kim | H01J 37/3244 |
| 2022/0032501 | A1 | 2/2022 | Aoki et al. | |
| 2022/0415691 | A1* | 12/2022 | Furukawa | H01L 21/6833 |
| 2023/0317432 | A1* | 10/2023 | Kuno | B32B 9/005 165/146 |
| 2023/0317433 | A1* | 10/2023 | Inoue | H01L 21/6833 361/234 |
| 2024/0006226 | A1* | 1/2024 | Kojima | H01L 21/6831 |
| 2024/0055240 | A1* | 2/2024 | Kojima | H01L 21/68785 |
| 2024/0297062 | A1* | 9/2024 | Inoue | H01L 21/67109 |
| 2024/0355656 | A1* | 10/2024 | Kuno | H01L 21/67103 |
| 2025/0259879 | A1* | 8/2025 | Inoue | H10P 72/7616 |
| 2025/0285909 | A1* | 9/2025 | Ishikawa | H01L 21/68757 |

FOREIGN PATENT DOCUMENTS

| | | | |
|---|---|---|---|
| JP | 2019-117861 | A | 7/2019 |
| JP | 2020-057786 | A | 4/2020 |
| KR | 10-2020-0003190 | A | 1/2020 |
| KR | 10-2022-0007269 | A | 1/2022 |
| KR | 10-2022-0082907 | A | 6/2022 |
| WO | 2018/230446 | A1 | 12/2018 |
| WO | 2020/153449 | A1 | 7/2020 |
| WO | 2020/217406 | A1 | 10/2020 |

OTHER PUBLICATIONS

English translation of the International Preliminary Report on Patentability (Chapter I) dated Jan. 9, 2025 (Application No. PCT/JP2022/026286).

Korean Office Action (Application No. 10-2023-7008998) dated Aug. 5, 2024 (with English translation) (11 pages).

* cited by examiner 20
22
23

MEMBER FOR SEMICONDUCTOR MANUFACTURING APPARATUS

BACKGROUND OF THE INVENTION

1. Field of the Invention

The present invention relates to a member for semiconductor manufacturing apparatus.

2. Description of the Related Art

A known conventional electrostatic chuck includes: a ceramic plate which has a wafer placement surface at an upper surface and incorporates an electrode; and a metal base plate bonded to the lower surface of the ceramic plate. PTL 1 discloses such an electrostatic chuck in which a ceramic plate internally includes: a gas common passage provided parallel to a wafer placement surface; gas outlet passages from the gas common passage to the wafer placement surface; and one gas inlet passage that penetrates a base plate in up-down direction, and communicates with the gas common passage.

CITATION LIST

Patent Literature

PTL 1: JP 2017-123396 A

SUMMARY OF THE INVENTION

However, when the gas common passage cannot be provided inside the ceramic plate due to circumstances, the gas common passage may be provided inside the base plate to cope with the circumstances. In that case, part of the gas outlet passage is provided in the base plate because the gas outlet passage is provided to reach the wafer placement surface from the gas common passage. Since the base plate is made of metal, an electric discharge may occur in the part of the gas outlet passage, provided in the base plate. To prevent such an electric discharge, an insulating pipe may be disposed in the part of the gas outlet passage, provided in the base plate. However, when such an insulating pipe is embedded in the base plate, the insulating pipe cannot be accessed from the outside of the base plate, thus a problem arises that the insulating pipe cannot be easily replaced.

The present invention has been made to solve such a problem, and it is a main object to prevent an electric discharge in the gas outlet passage, and allow maintenance for preventing an electric discharge to be performed easily.

[1] A member for semiconductor manufacturing apparatus of the present invention includes: a ceramic plate having a wafer placement surface at an upper surface and incorporating an electrode; a conductive base plate provided on a lower surface side of the ceramic plate; a gas common passage provided inside the conductive base plate; gas outlet passages provided for the gas common passage to reach the wafer placement surface from the gas common passage; at least one gas inlet passage provided for the gas common passage and provided so as to communicate with the gas common passage from a lower surface of the conductive base plate, the number of the at least one gas inlet passage being less than the number of the gas outlet passages; and an insulating sleeve disposed in a base plate through-hole which penetrates the base plate in up-down direction. The insulating sleeve has a first communication hole that constitutes part of the gas common passage, and a second communication hole that is provided to reach an upper surface of the insulating sleeve from the first communication hole, and constitutes part of the gas outlet passages.

In the member for semiconductor manufacturing apparatus, a gas is introduced from the gas inlet passage provided in the base plate. The gas introduced into the gas inlet passage is distributed to the gas outlet passages provided in the gas common passage through the gas common passage, and flows out to the wafer placement surface through the gas outlet passages. Since the number of gas inlet passages is less than the number of gas outlet passages, the number of gas introduction pipes connected to the gas inlet passage from the outside can be reduced. The insulating sleeve is disposed in the base plate through-hole which penetrates the base plate in up-down direction. The insulating sleeve has the first communication hole that constitutes part of the gas common passage, and the second communication hole that constitutes part of the gas outlet passages, and the part of the gas outlet passages, provided in the base plate is formed by the second communication hole of the insulating sleeve. Thus, an electric discharge can be prevented from occurring in the gas outlet passages. In addition, when the second communication hole of an insulating sleeve, which is part of a gas outlet passage, deteriorates with the use of the member for semiconductor manufacturing apparatus, the insulating sleeve can be detached from the lower surface side of the base plate, and a new insulating sleeve can be attached. Therefore, maintenance for preventing an electric discharge can be performed easily.

[2] In the member for semiconductor manufacturing apparatus (the member for semiconductor manufacturing apparatus according to [1]) of the present invention, the insulating sleeve may be one member which is unable to be disassembled. In this configuration, replacement work can be performed easily, as compared to when the insulating sleeve is comprised of multiple members.

[3] In the member for semiconductor manufacturing apparatus (the member for semiconductor manufacturing apparatus according to [1] or [2]) of the present invention, the first communication hole of the insulating sleeve may be provided radially in at least three directions around the second communication hole in a plan view. In this configuration, when the insulating sleeve is inserted into the base plate through-hole, regardless of the rotation position of the insulating sleeve, the gas which has flowed through the gas common passage can be sent out to the gas outlet passages.

[4] In the member for semiconductor manufacturing apparatus (the member for semiconductor manufacturing apparatus according to any one of [1] to [3]) of the present invention, the outer diameter of the insulating sleeve may be smaller than the width of the gas common passage. In this configuration, part of the gas flowing from upstream of the gas common passage can move downstream of the gas common passage through the outside of the insulating sleeve.

[5] In the member for semiconductor manufacturing apparatus (the member for semiconductor manufacturing apparatus according to any one of [1] to [4]) of the present invention, the ceramic plate and the base plate may be bonded by a conductive bonding layer, and the insulating sleeve may be inserted in the conductive bonding layer. In this configuration, part of the gas outlet passages, which passes through the conductive bonding layer is also covered by the insulating sleeve, thus an electric discharge in the part can be prevented from occurring.

[6] In the member for semiconductor manufacturing apparatus (the member for semiconductor manufacturing apparatus according to any one of [1] to [5]) of the present invention, the upper surface of the insulating sleeve may be adhered to the ceramic plate with an upper resin adhesive layer interposed between the upper surface and the ceramic plate, and a lower portion of the insulating sleeve may be mounted on the base plate with a lower resin adhesive layer or a seal material interposed between the lower portion and the base plate. In this configuration, the insulation performance of the upper surface side of the insulating sleeve can be ensured, and gas can be prevented from leaking to the outside from the outer periphery of the insulating sleeve.

BRIEF DESCRIPTION OF THE DRAWINGS

FIG. 9A is a perspective view of an insulating sleeve 160 and FIG. 9B is a vertical cross-sectional view.

DETAILED DESCRIPTION OF THE INVENTION

Figure 1:
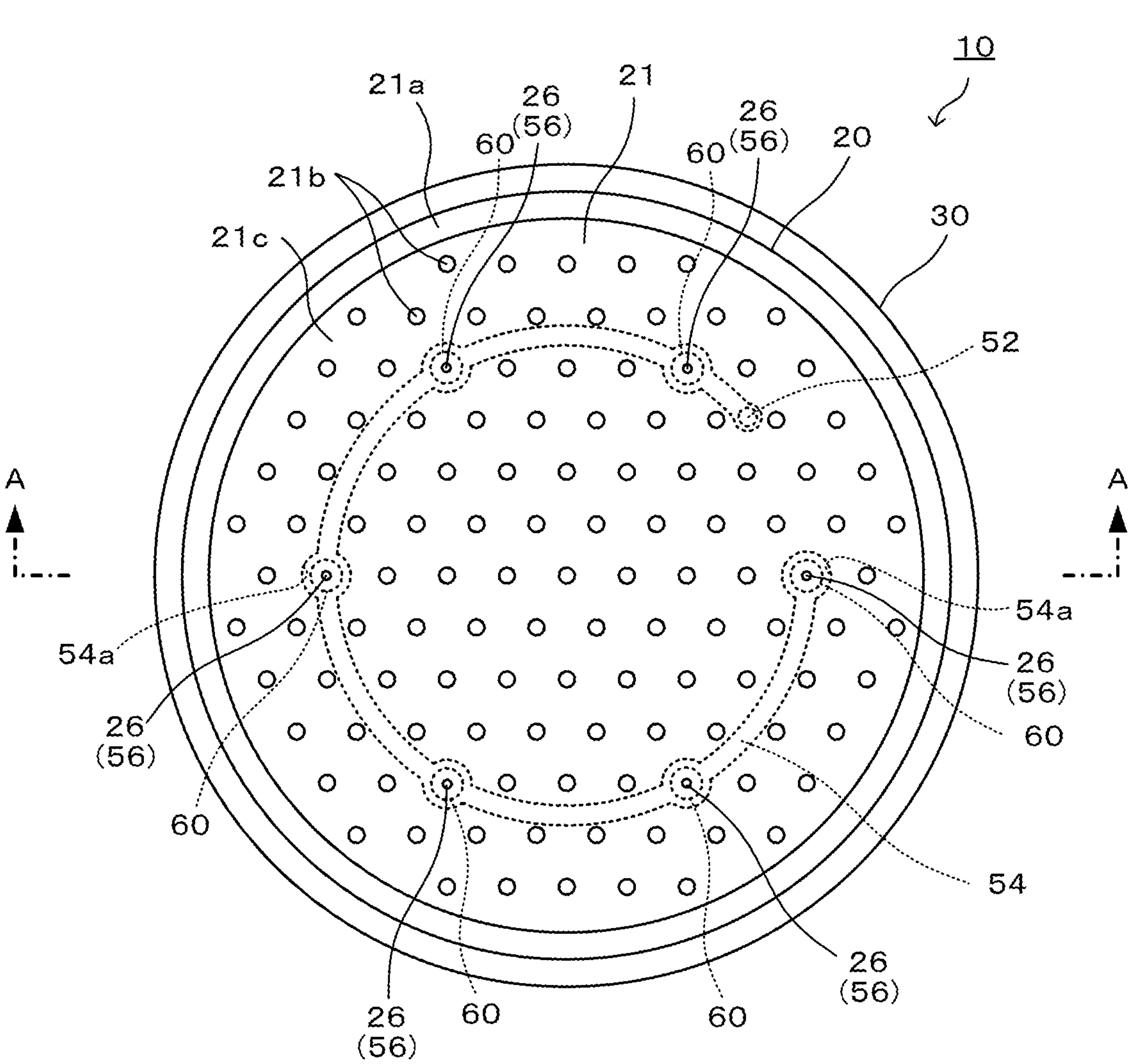
FIG. 1 is a plan view of a wafer placement table 10.
Figure 2:
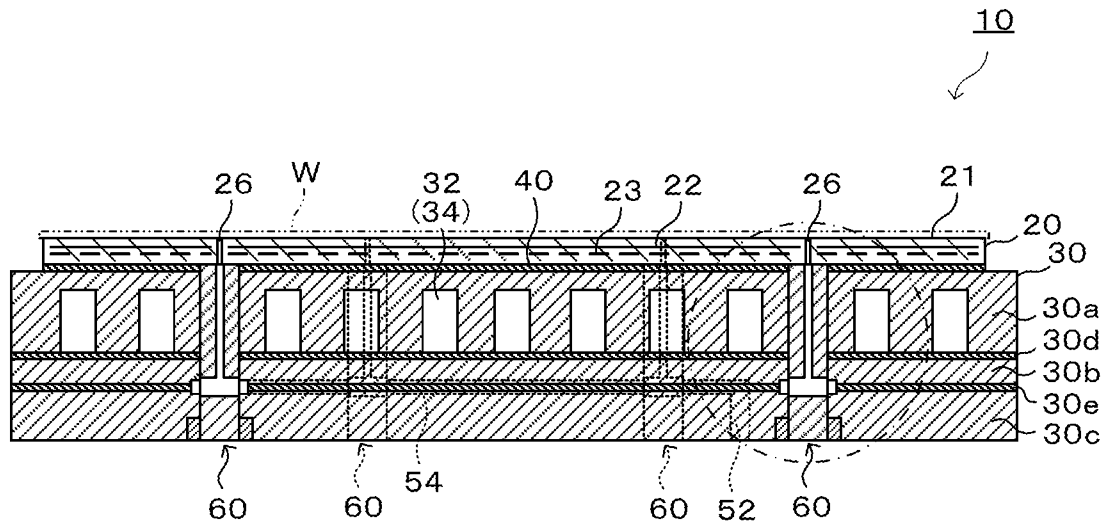
FIG. 2 is a cross-sectional view taken along A-A of FIG. 1.
Figure 3:
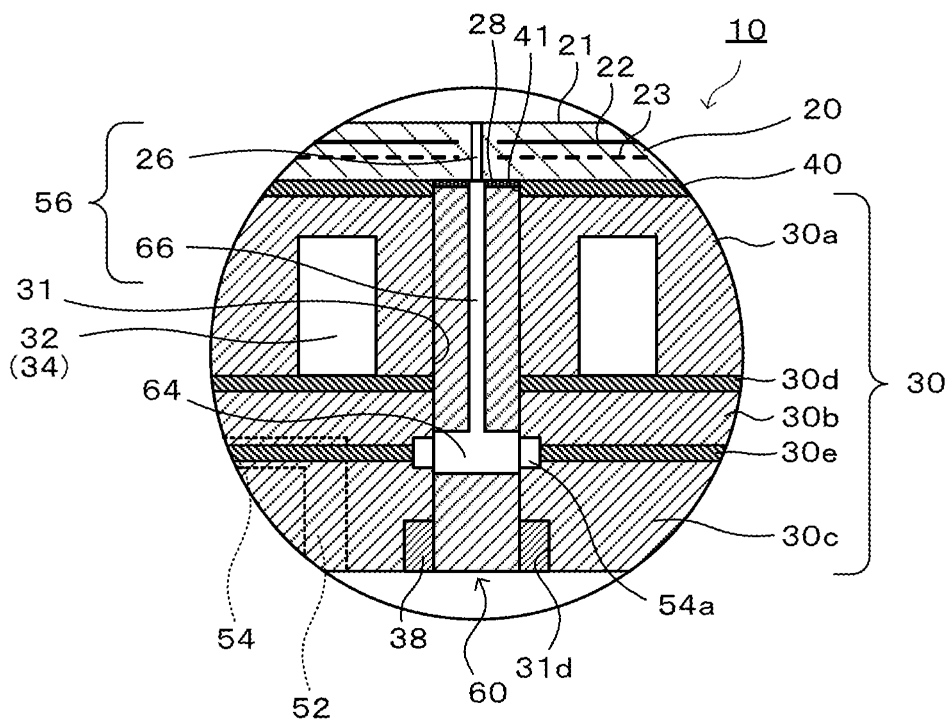
FIG. 3 is a partial enlarged view of FIG. 2.
Figure 4:
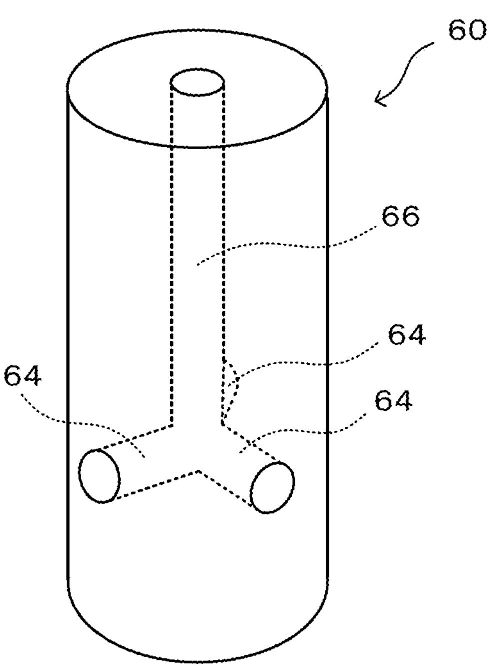
FIG. 4 is a perspective view of an insulating sleeve 60.
Figure 5:
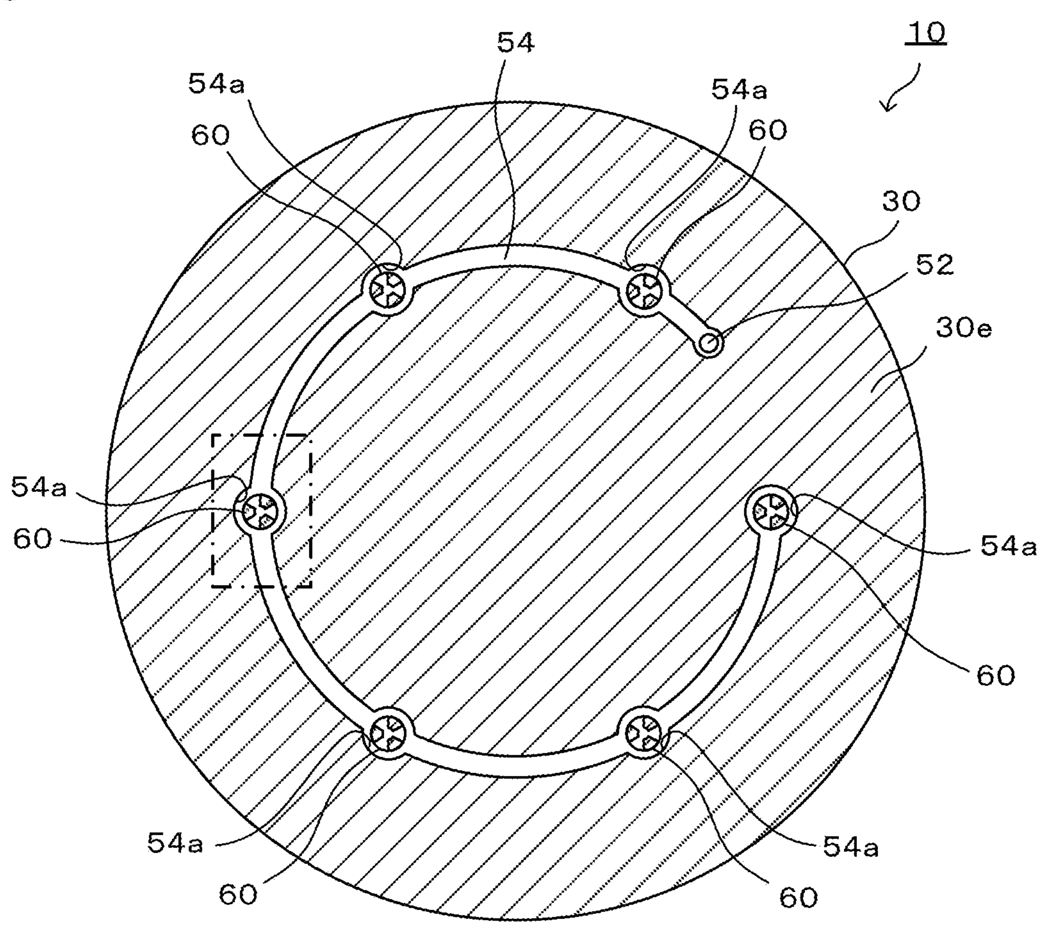
FIG. 5 is a sectional view from above when the wafer placement table 10 is cut along a horizontal plane passing through a gas common passage 54.
Figure 6:
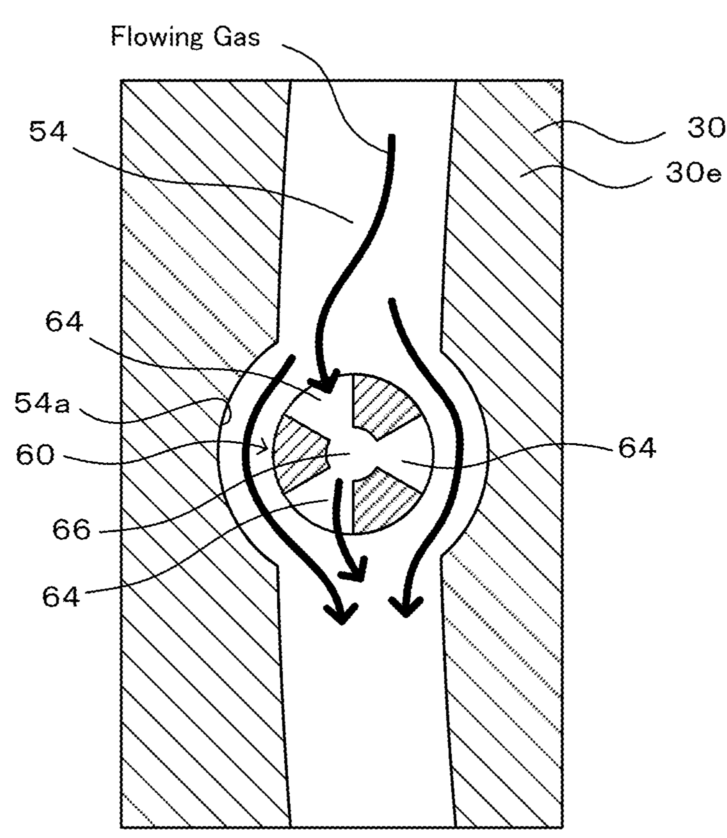
FIG. 6 is a partial enlarged view of FIG. 5.

Next, an exemplary embodiment of the present invention will be described with reference to the accompanying drawings. FIG. 1 is a plan view of a wafer placement table 10, FIG. 2 is a cross-sectional view taken along A-A of FIG. 1, FIG. 3 is a partial enlarged view (enlarged view within the frame of the dashed-dotted line) of FIG. 2, FIG. 4 is a perspective view of an insulating sleeve 60, FIG. 5 is a sectional view from above when the wafer placement table 10 is cut along a horizontal plane passing through a gas common passage 54, and FIG. 6 is a partial enlarged view (enlarged view within the frame of the dashed-dotted line) of FIG. 5. Note that in the present specification, "upper" and "lower" do not indicate an absolute positional relationship, but indicates a relative positional relationship. Thus, depending of the orientation of the wafer placement table 10, "upper" and "lower" may indicate "lower" and "upper", "left" and "right", or "front" and "back".

The wafer placement table 10 is an example of the member for semiconductor manufacturing apparatus of the present invention, and as illustrated in FIG. 2, includes a ceramic plate 20, a conductive base plate 30, a conductive bonding layer 40, a gas common passage 54, a gas inlet passage 52, gas outlet passages 56, and insulating sleeves 60.

The ceramic plate 20 is a circular (for example, with a diameter of 300 mm, and a thickness of 5 mm) plate made of ceramic, such as an alumina sintered body and an aluminum nitride sintered body. The upper surface of the ceramic plate 20 is a wafer placement surface 21 on which a wafer W is placed. In the ceramic plate 20, an electrostatic electrode 22 and a heater electrode 23 are incorporated in that order from the wafer placement surface 21. As illustrated in FIG. 1, a ring-shaped seal band 21*a* is formed along the outer edge of the wafer placement surface 21 of the ceramic plate 20, and a plurality of circular small projections 21*b* are formed on the entire surface inside the seal band 21*a*. The seal band 21*a* and the circular small projections 21*b* have the same height which is, for example, several μm to several 10 μm. Part of the wafer placement surface 21, not provided with the seal band 21*a* and the circular small projections 21*b*, is referred to as a reference surface 21*c*. The ceramic plate 20 has gas blowout holes 26, each of which constitutes part of a gas outlet passage 56. A plurality of (six herein) gas blowout holes 26 are provided concentrically to the ceramic plate 20. The gas blowout holes 26 are opened in the reference surface 21*c* of the wafer placement surface 21.

The electrostatic electrode 22 is a planar mesh electrode, and coupled to an external DC power supply through a power supply member which is not illustrated. The power supply member is electrically insulated from the conductive bonding layer 40 and the base plate 30. When a DC voltage is applied to the electrostatic electrode 22, the wafer W is absorbed and fixed to the wafer placement surface 21 (specifically, the upper surface of the seal band 21*a* and the upper surface of the circular small projections 21*b*) by an electrostatic adsorption force, and when application of the DC voltage is stopped, adsorption and fixing of the wafer W to the wafer placement surface 21 is stopped.

The heater electrode 23 is a resistance heating element wired from one end to the other end on the entire ceramic plate 20 in a plan view in a one-stroke pattern. The one end and the other end of the heater electrode 23 are coupled to a heater power supply via a power supply member which is not illustrated. The power supply member is electrically insulated from the conductive bonding layer 40 and the base plate 30. When energized, the heater electrode 23 generates heat, and heats the wafer placement surface 21, and eventually, the wafer W.

The base plate 30 is a disk (disk with a diameter equal to or greater than the diameter of the ceramic plate 20) having favorable electrical conductivity and thermal conductivity. In this embodiment, the base plate 30 is obtained by bonding a first layer 30*a*, a second layer 30*b*, a third layer 30*c* by conductive bonding layers 30*d*, 30*e*.

A refrigerant flow path 32 in which a refrigerant circulates is formed inside the base plate 30. The refrigerant flow path 32 is formed by a refrigerant flow path groove 34, which is a recessed groove, provided in the lower surface of the first layer 30*a*; and the conductive bonding layer 30*d* that closes a lower opening of the refrigerant flow path groove 34. The refrigerant which flows through the refrigerant flow path 32 is preferably liquid, and it is preferable that the refrigerant be electrically insulative. As electrically insulative liquid, for example, fluorine-based inert liquid may be mentioned. The refrigerant flow path 32 is formed from one end (entry) to the other end (exit) on the entirety of the base plate 30 in a one-stroke pattern in a plan view. The one end and the other end of the refrigerant flow path 32 are respectively connected to a supply port and a collection port of an external refrigerant device which is not illustrated. The refrigerant supplied through the supply port of the external refrigerant device to the one end of refrigerant flow path 32 passes through the refrigerant flow path 32, then returns to the collection port of the external refrigerant device through the other end of the refrigerant flow path 32, and is adjusted in temperature, then supplied to the one end of the refrigerant flow path 32 again through the supply port. The base plate 30 is coupled to a radio frequency (RF) power supply, and also used as an RF electrode.

The materials of the base plate 30 include, for example, a metal material, and a composite material of metal and ceramic. As the metal material, Al, Ti, Mo, and an alloy thereof may be mentioned. As the composite material of metal and ceramic, a metal matrix composite (MMC) material and a ceramic matrix composite (CMC) material may be mentioned. Specific examples of such a composite material include a material containing Si, SiC and Ti (also referred to as SiSiCTi), a material obtained by impregnating SiC porous body with Al and/or Si, and a composite material of $Al_2O_3$ and TiC. As the material used for the base plate 30, it is preferable to select a material having a thermal expansion coefficient closer to that of the material for the ceramic plate 20. Of the base plate 30, the first layer 30*a*, the second layer 30*b* and the third layer 30*c* may be produced with the above-mentioned metal materials and composite materials of metal and ceramic, and the conductive bonding layers 30*d*, 30*e* may be produced with the same material for the below-described conductive bonding layer 40.

The conductive bonding layer 40 is, for example, a metal bonding layer, and bonds the lower surface of the ceramic plate 20 and the upper surface of the base plate 30. The conductive bonding layer 40 is formed by thermal compression bonding (TCB), for example. TCB is a publicly known method, by which a metal bonding material is inserted between two members to be bonded, and the two members are pressure-bonded in a state of heated to a temperature lower than or equal to the solidus temperature of the metal bonding material.

The gas common passage 54 is provided parallel to the wafer placement surface 21 (that is, in a horizontal direction) inside the base plate 30. Note that "parallel" indicates completely parallel as well as not completely parallel within a range of acceptable error (for example, tolerance). As illustrated in FIG. 2, the gas common passage 54 is a passage provided between the second layer 30*b* and the third layer 30*c* of the base plate 30, and is provided below the refrigerant flow path 32. The height in up-down direction of the gas common passage 54 includes the height (thickness) in up-down direction of the conductive bonding layer 30*e*. As illustrated in FIG. 5, the gas common passage 54 is formed in a C-shape (arc shape) in a plan view, and has multiple (six herein) sleeve insertion sections 54*a* from one end to the other end. Each sleeve insertion section 54*a* is a section where the gas common passage 54 is locally expanded arcuately in a plan view, and its inner diameter is larger than the outer diameter of the insulating sleeve 60. Thus, space where gas can pass is formed between an arcuate wall of the sleeve insertion section 54*a* and the insulating sleeve 60. Multiple sleeve insertion sections 54*a* are provided substantially at regular intervals along the gas common passage 54. Multiple insulating sleeves 60 are provided substantially at regular intervals concentrically to the circle for the outer shape of the wafer placement table 10.

Multiple (six herein) gas outlet passages 56 are provided for one gas common passage 54 to reach the reference surface 21*c* of the wafer placement surface 21 from the gas common passage 54.

The gas inlet passage 52 is provided to reach one end of the gas common passage 54 from the lower surface (the surface on the opposite side of the wafer placement table 10 from the wafer placement surface 21) of the base plate 30. The number of at least one gas inlet passage 52 is less than the number of gas outlet passages 56 communicating with the gas common passage 54, and specifically one gas inlet passage 52 is provided herein.

As illustrated in FIG. 3, each insulating sleeve 60 is disposed in a base plate through-hole 31 that penetrates the base plate 30 in up-down direction. The insulating sleeve 60 is produced with an electrically insulative material (for example, the same material as the ceramic plate 20). The base plate through-hole 31 is provided so as not to penetrate the refrigerant flow path 32. As illustrated in FIG. 4, the insulating sleeve 60 is one cylindrical body which is unable to be disassembled, and has a first communication hole 64 that constitutes part of the gas common passage 54, and a second communication hole 66 that constitutes part of the gas outlet passage 56. The first communication hole 64 is provided in a horizontal direction. In this embodiment, as illustrated in FIG. 6, the first communication hole 64 is formed radially in three directions at every equal angle (or substantially equal angle) around the second communication hole 66 in a plan view. It is preferable that the first communication hole 64 expand in an outer radial direction from the center of the insulating sleeve 60. As illustrated in FIG. 3, the second communication hole 66 is provided from each of intersection points of multiple first communication holes 64 to the upper surface of the insulating sleeve 60 along the central axis of the insulating sleeve 60. The second communication hole 66 together with the gas blowout hole 26 of the ceramic plate 20 constitutes the gas outlet passage 56. As illustrated in FIG. 3, an upper portion of the insulating sleeve 60 is inserted into a bonding layer through-hole 41 that penetrates the conductive bonding layer 40 in up-down direction, and is adhered to the ceramic plate 20 with an insulating resin adhesive layer 28 interposed between the upper portion and the ceramic plate 20. The lower portion of the base plate through-hole 31 forms a large diameter section 31*d* which is larger in diameter than the other portion of the base plate through-hole 31. The lower portion of the insulating sleeve 60 is adhered and fixed by a resin adhesive layer 38 filled between the insulating sleeve 60 and the large diameter section 31*d* of the base plate through-hole 31.

Figures 7A, 7B, 7C, 7D, 7E, 7F, 7G:
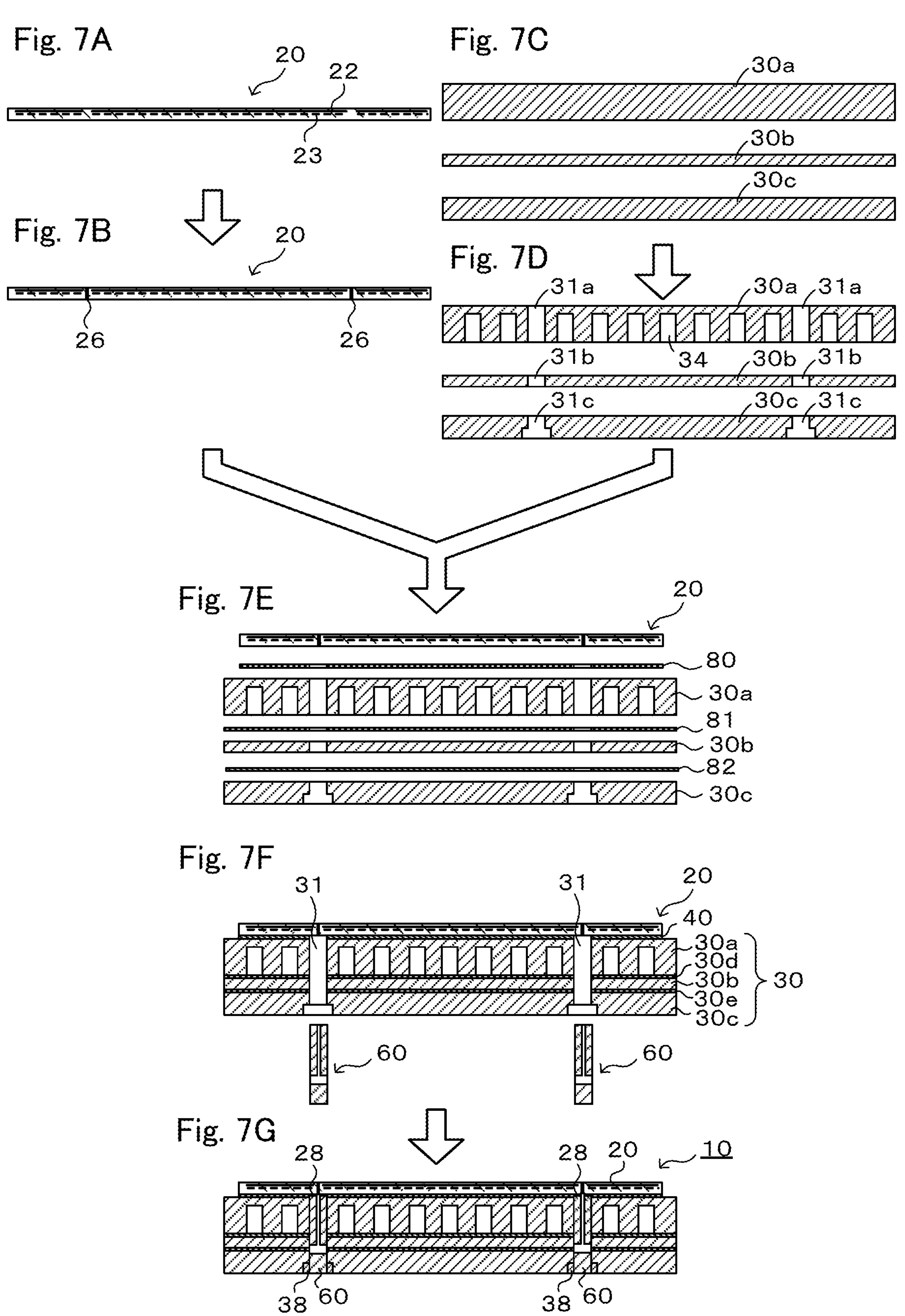
FIGS. 7A to 7G illustrate manufacturing process diagrams of the wafer placement table 10.

Next, an example of a manufacturing method for the wafer placement table 10 will be described based on FIGS. 7A to 7G. FIGS. 7A to 7G illustrate manufacturing process diagrams of the wafer placement table 10. Herein, a case is exemplified in which the base plate 30 is produced by MMC. First, the ceramic plate 20 incorporating electrostatic electrode 22 and heater electrode 23 is prepared (FIG. 7A). For example, a molded body of ceramic powder incorporating electrostatic electrode 22 and heater electrode 23 is produced, and the ceramic plate 20 is obtained by hot-press firing the molded body. Subsequently, the gas blowout holes 26 are formed in the ceramic plate 20 (FIG. 7B).

Concurrently, the first to third layers 30*a* to 30*c* made of MMC are prepared (FIG. 7C). Then grooves and holes are formed as needed in the first to third layers 30*a* to 30*c* by a machining process (FIG. 7D). Specifically, the refrigerant flow path groove 34 is formed in the lower surface of the first layer 30*a*. Along with this, a first layer through-hole 31*a*, which penetrates the first layer 30*a* in up-down direction, is formed in the first layer 30*a*. In addition, a second layer through-hole 31*b*, which penetrates the second layer 30*b* in up-down direction, is formed in the second layer 30*b*, and a third layer through-hole 31*c* with a step, which penetrates the third layer 30*c* in up-down direction, is formed in the third layer 30*c*. The first layer through-hole 31*a* to the third layer through-hole 31*c* constitute the base plate through-hole 31. Also, a recessed groove (not illustrated), which eventually serves as the gas common passage 54, is formed in the lower surface of the second layer 30*b* and the upper surface of the third layer 30*c*. For example, when the ceramic plate 20 is made of alumina, the first to third layers 30*a* to 30*c* are preferably made of SiSiCTi or AlSiC. This is because the thermal expansion coefficient of alumina can be made approximately equal to the thermal expansion coefficients of SiSiCTi and AlSiC.

A layer (disk member) made of SiSiCTi can be produced as follows, for example. First, silicon carbide, metal Si and metal Ti are mixed to produce a powder mixture. Next, a disk-shaped molded body is produced by applying uniaxial pressure molding to the obtained powder mixture, and hot-press sintering is applied to the molded body in an inert atmosphere to obtain a disk member made of SiSiCTi.

Subsequently, a metal bonding material 82 is disposed between the third layer 30*c* and the second layer 30*b*, a metal bonding material 81 is disposed between the second layer 30*b* and the first layer 30*a*, and a metal bonding material 80 is disposed between the first layer 30*a* and the ceramic plate 20 (FIG. 7E). Through-holes are provided in advance in the metal bonding materials 80, 81, 82 at positions opposed to the first layer through-hole 31*a* to the third layer through-hole 31*c*. In addition, a through-hole (elongated hole) is provided in advance in the metal bonding material 81 at a position where the gas common passage 54 is formed. Subsequently, a layered body is obtained by laminating these layers, and the layered body is pressurized and bonded at a temperature (for example, the solidus temperature minus 20° C. or higher and the solidus temperature or lower) lower than or equal to the solidus temperature of the metal bonding materials 80, 81, 82, and subsequently, the temperature is returned to the room temperature. Consequently, the first layer 30*a* to the third layer 30*c* are bonded by the conductive bonding layers 30*d*, 30*e* to which the metal bonding materials 81, 82 have changed to produce the base plate 30, and the ceramic plate 20 and the base plate 30 are bonded by the conductive bonding layer 40 to which the metal bonding material 80 has changed (FIG. 7F). In addition, the first layer through-hole 31*a* to the third layer through-hole 31*c* are connected to form the base plate through-hole 31. As the metal bonding materials 80, 81, 82, an Al—Mg based bonding material and an Al—Si—Mg based bonding material may be used. For example, when TCB is performed using an Al—Si—Mg based bonding material, the layered body is pressurized in a state of heated in a vacuum atmosphere.

Subsequently, a resin paste as an adhesive material is applied to the ceramic plate 20 exposed to the bottom surface of the base plate through-hole 31, the insulating sleeve 60 is inserted into the base plate through-hole 31, and adhered to the ceramic plate 20, then finally, the periphery of the lower portion of the insulating sleeve 60 is sealed with the resin paste. As a result, the upper portion of the insulating sleeve 60 is adhered to the ceramic plate 20 with the resin adhesive layer 28 interposed therebetween, and the lower portion of the insulating sleeve 60 is sealed with the resin adhesive layer 38. In this manner, the wafer placement table 10 is obtained (FIG. 7G).

Next, an example of a production method for the insulating sleeve 60 will be described. Such an insulating sleeve 60 can be produced in accordance with the "METHOD FOR MANUFACTURING THREE-DIMENSIONAL FIRED BODY" in WO 2020/217406.

First, an insulating sleeve molded body is produced. After being fired, an insulating sleeve molded body becomes the insulating sleeve 60. The dimensions of the insulating sleeve molded body are determined based on the dimensions of the insulating sleeve 60 in consideration of thermal tightening of the insulating sleeve 60 when fired. An insulating sleeve molded body is produced using a mold. The mold is such that a cup-shaped (bottomed cylindrical) body having a core inside. The shape of the inner space (space for molding) of the mold with the core excluded has the same shape as the insulating sleeve molded body.

The mold is produced by a well-known 3D printer. The 3D printer repeats a series of operations, that is, discharging pre-curing fluid from a head unit to a stage to form a pre-curing layered material, and curing the pre-curing layered material. As the pre-curing fluid, the 3D printer has: a model material which is a material constituting finally needed portions of a mold; and a support material constituting a base portion which supports the model material and which is to be finally removed. As the model material, a material (for example, wax such as paraffin wax) insoluble in predetermined cleaning liquid (such as water, an organic solvent, acid, an alkaline solution) is used, and as the support material, a material (for example, hydroxylated wax) soluble to predetermined cleaning liquid is used. A 3D printer creates a structure using slice data obtained by slicing a mold layer by layer at every predetermined intervals from the bottom to the top in a horizontal direction. The slice data is generated by processing CAD data. In some slice data, the model material and the support material are mixed, whereas other slice data has only model material. A structure created by a 3D printer is immersed in cleaning liquid, and a post-cured support material is dissolved and removed, thus an object composed of only the post-cured model material, in other words, a mold is obtained.

An insulating sleeve molded body is produced by mold cast molding using the mold. Specifically, a ceramic slurry containing ceramic powder, a solvent, dispersant and a gelling agent is injected to a molding space of a mold to cause the ceramic slurry to turn into a gel by a chemical reaction of the gelling agent, thereby producing an insulating sleeve molded body inside the mold. Subsequently, of the mold with an insulating sleeve molded body produced inside, only the mold is melted and removed, or fired and removed, thus the insulating sleeve molded body is obtained. Finally, the insulating sleeve molded body is fired, and the outer dimensions of the fired body are adjusted, thus the insulating sleeve 60 is obtained.

Next, an example of use of thus configured wafer placement table 10 will be described. First, with the wafer placement table 10 installed in a chamber which is not unillustrated, the wafer W is placed on the wafer placement surface 21. The pressure in the chamber is then reduced and adjusted by a vacuum pump to achieve a predetermined degree of vacuum, and a DC voltage is applied to the electrostatic electrode 22 of the ceramic plate 20 to generate an electrostatic adsorption force and cause the wafer W to be absorbed and fixed to the wafer placement surface 21 (specifically, the upper surface of the seal band 21*a* and the upper surfaces of the circular small projections 21*b*). In addition, the heater electrode 23 is energized to cause the ceramic plate 20 to generate heat, and the wafer W is heated to a predetermined temperature. Furthermore, a back side gas is introduced into the gas inlet passage 52 from a gas cylinder which is not illustrated. A heat transfer gas (for example, He gas) is used as the back side gas. The back side gas introduced into the gas inlet passage 52 is distributed to multiple gas outlet passages 56 through the gas common passage 54, and filled and sealed in the space (the space surrounded by the back surface of the wafer W, and the seal band 21*a*, the circular small projections 21*b* and the reference surface 21*c* of the wafer placement surface 21) between the back surface of the wafer W and the reference surface 21*c* of the wafer placement surface 21. Heat is efficiently transferred between the wafer W and the ceramic plate 20 due to the presence of the back side gas. Next, a reactive gas atmosphere with a predetermined pressure (for example, several 10s to several 100s of Pa) is formed in the chamber, and in this state, a RF voltage is applied across an upper electrode (not illustrated) provided in a ceiling portion in the chamber and the base plate 30 of the wafer placement table 10 to generate a plasma. The surface of the wafer W is processed by the generated plasma. A refrigerant is circulated as needed through the refrigerant flow path 32 of the base plate 30.

As illustrated in FIG. 6, when the heat transfer gas flowed into the gas inlet passage 52 reaches the insulating sleeve 60 from upstream of the sleeve insertion section 54*a* of the gas common passage 54, part of the heat transfer gas flows in the first communication hole 64 of the insulating sleeve 60. The part of the gas flowed into the first communication hole 64 is supplied to the space on the back of the wafer W through the second communication hole 66 and the gas blowout hole 26 (that is, gas outlet passage 56), and the remaining gas passes through another first communication hole 64, and flows downstream of the insulating sleeve 60 of the gas common passage 54. Also, the gas, which has not flowed into the first communication hole 64 of the insulating sleeve 60, flows downstream of the insulating sleeve 60 through the gap between the insulating sleeve 60 and the sleeve insertion section 54*a* of the gas common passage 54.

In the wafer placement table 10 described in detail above, gas is introduced through the gas inlet passage 52 provided in the base plate 30. The gas introduced into the gas inlet passage 52 passes through the gas common passage 54, and is distributed to multiple gas outlet passages 56 provided in the gas common passage 54, and passes through the gas outlet passages 56 to flow out to the wafer placement surface 21. Since the numbers of gas inlet passages 52 is less than the number of gas outlet passages 56, the number of gas introduction pipes connected to the gas inlet passages 52 from the outside can be reduced. Here, the insulating sleeve 60 is disposed in each base plate through-hole 31 which penetrates the base plate 30 in up-down direction. The insulating sleeve 60 has the first communication hole 64 that constitutes part of the gas common passage 54, and the second communication hole 66 that constitutes part of the gas outlet passage 56, and part of the gas outlet passage 56, provided in the base plate 30 is constituted by the second communication hole 66 of the insulating sleeve 60. Thus, it is possible to prevent an electric discharge from occurring in the gas outlet passage 56. In addition, when the second communication hole 66 of the insulating sleeve 60, as part of the gas outlet passage 56, deteriorates with the use of the wafer placement table 10, the insulating sleeve 60 can be detached from the lower surface side of the base plate 30, and a new insulating sleeve 60 can be attached. Therefore, maintenance for preventing an electric discharge can be performed easily.

Since the insulating sleeve 60 is one cylindrical body which is unable to be disassembled, replacement work can be performed easily, as compared to when the insulating sleeve is comprised of multiple members. In this configuration, replacement work can be performed easily, as compared to when the insulating sleeve is comprised of multiple members.

Also, the first communication hole 64 of the insulating sleeve 60 is provided radially in three directions around the second communication hole 66 in a plan view. Thus, when the insulating sleeve 60 is inserted into the base plate through-hole 31, regardless of the rotation position of the insulating sleeve 60, the gas which has flowed from upstream of the gas common passage 54 can be sent out to the second communication hole 66 (gas outlet passage 56) (FIG. 6).

Also, the outer diameter of the insulating sleeve 60 is smaller than the width of the sleeve insertion section 54*a* of the gas common passage 54. Thus, part of the gas which has flowed from upstream of the gas common passage 54 can move downstream of the gas common passage 54 through the outside (between the insulating sleeve 60 and the sleeve insertion section 54*a*) of the insulating sleeve 60 (FIG. 6).

In addition, the ceramic plate 20 and the base plate 30 are bonded by the conductive bonding layer 40, and the insulating sleeve 60 is inserted into the conductive bonding layer 40. In this configuration, part of the gas outlet passages 56, which passes through the conductive bonding layer 40 is also covered by the insulating sleeve 60, thus an electric discharge in the part can be prevented from occurring.

Also, the upper surface of the insulating sleeve 60 is adhered to the ceramic plate 20 with the resin adhesive layer 28 interposed therebetween, and the lower portion of the insulating sleeve 60 is mounted on the base plate 30 with the resin adhesive layer 38 interposed therebetween. Thus, the insulation performance of the upper surface side of the insulating sleeve 60 can be ensured, and gas can be prevented from leaking to the outside from the outer periphery of the insulating sleeve 60.

In addition, one gas inlet passage 52 is provided for one gas common passage 54. Thus, the number of gas inlet passages 52 provided in the base plate 30 can be reduced as much as possible.

The height of the first communication hole 64 of the insulating sleeve 60 includes the height of the gas common passage 54. For this reason, when the insulating sleeve 60 is inserted into the base plate through-hole 31, there is little possibility that the cross section of the gas common passage 54 is reduced due to displacement in up-down direction of the first communication hole 64 of the insulating sleeve 60 relative to the gas common passage 54 of the base plate 30.

Needless to say, the present invention is not limited to the embodiment described above, and can be implemented in various modes within the technical scope of the present invention.

Figure 8:
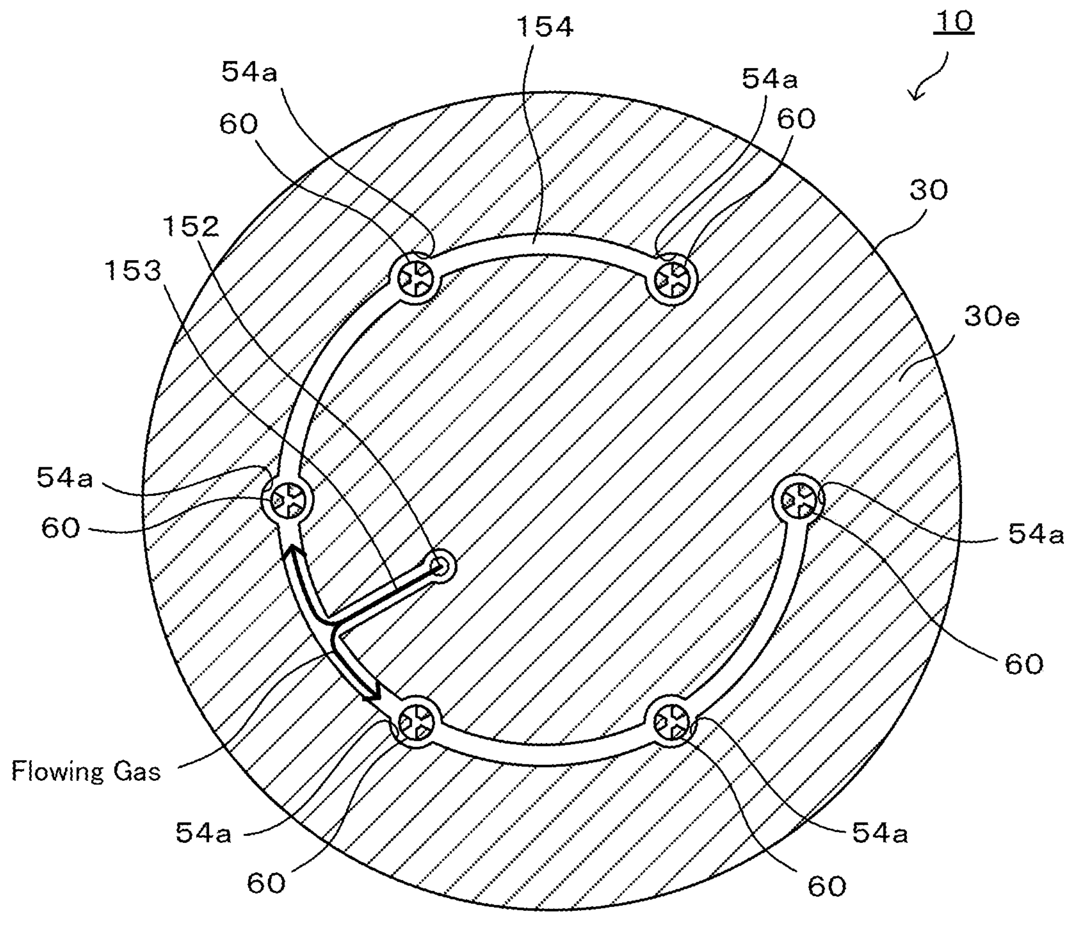
FIG. 8 is an explanatory view of a gas common passage 154.

In the above-described embodiment, the gas inlet passage 52 is connected to one end of the gas common passage 54; however, the invention is not particularly limited to this. For example, as illustrated in FIG. 8, a gas auxiliary passage 153 may be formed which extends horizontally from the center of the C-shaped gas common passage 154 to the center of the wafer placement table 10 in a plan view, and the gas inlet passage 152 extending in up-down direction may be connected to an end of the gas auxiliary passage 153 from the lower surface of the base plate 30. In this situation, each of both ends of the gas common passage 154 is provided with the sleeve insertion section 54*a* and the insulating sleeve 60. When the gas introduced into the gas inlet passage 152 flows to the gas common passage 54 from the gas auxiliary passage 153, the gas flows into two directions: the clockwise direction and the counterclockwise direction. Note that in FIG. 8, the same components as in the above-described embodiment are labeled with the same symbol.

Figures 9A, 9B:
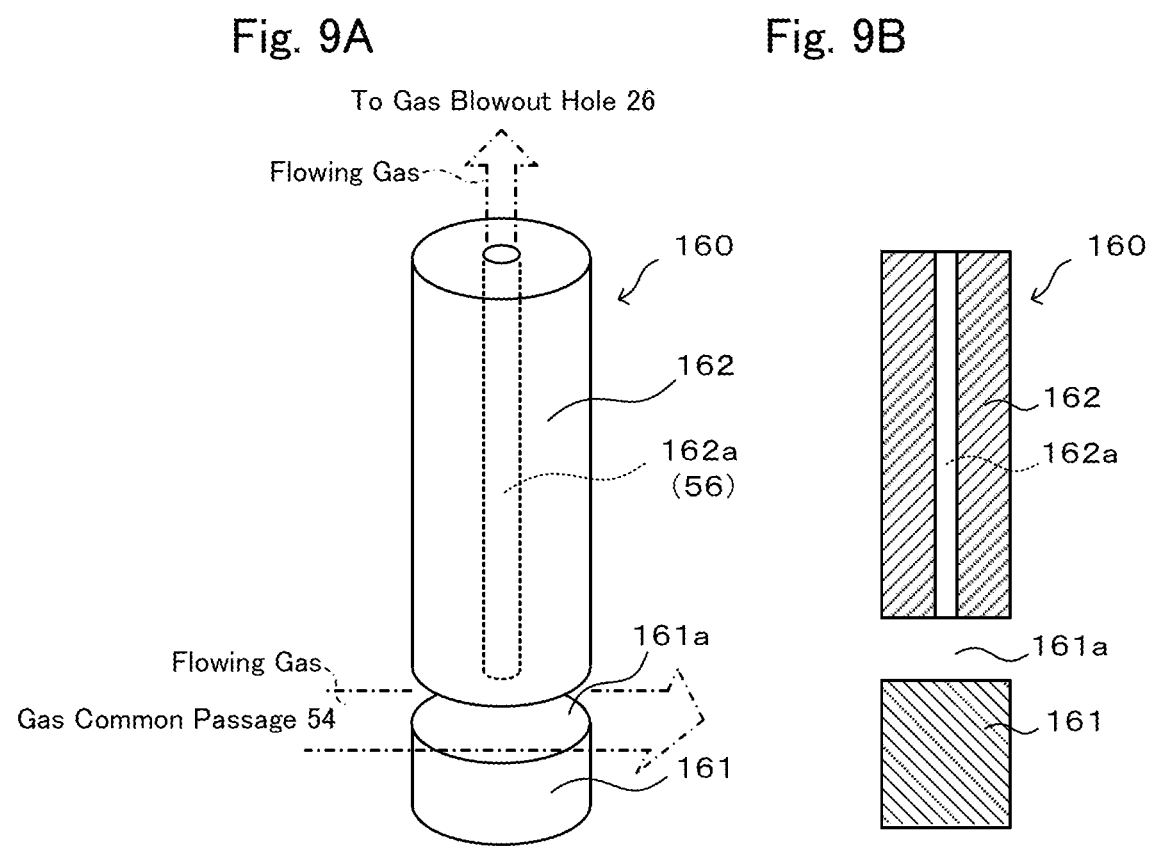

In the above-described embodiment, the insulating sleeve 60 is one member which is unable to be disassembled; however, the invention is not particularly limited to this. For example, as illustrated in FIGS. 9A and 9B, instead of the insulating sleeve 60, an insulating sleeve 160 including a lower cylindrical body 161 and an upper cylindrical body 162 which are independent to each other may be used. FIG. 9A is a perspective view of an insulating sleeve 160, and FIG. 9B is its vertical cross-sectional view. The lower cylindrical body 161 and the upper cylindrical body 162 are produced with an electrically insulative material (for example, the same material as the ceramic plate 20). The lower cylindrical body 161 is a solid cylindrical body. A gap is formed between the upper surface of the lower cylindrical body 161 and the lower surface of the upper cylindrical body 162. The gap is a first communication hole 161*a* that constitutes part of the gas common passage 54. The upper cylindrical body 162 has a second communication hole 162*a*. The second communication hole 162*a* communicates with the gas blowout hole 26, and constitutes the gas outlet passage 56 along with the gas blowout hole 26. Even when such an insulating sleeve 160 is used, the same effect as in the above-described embodiment is obtained. However, since the insulating sleeve 160 is comprised of two independent members, replacement work is slightly complicated, as compared to the insulating sleeve 60.

Figure 10:
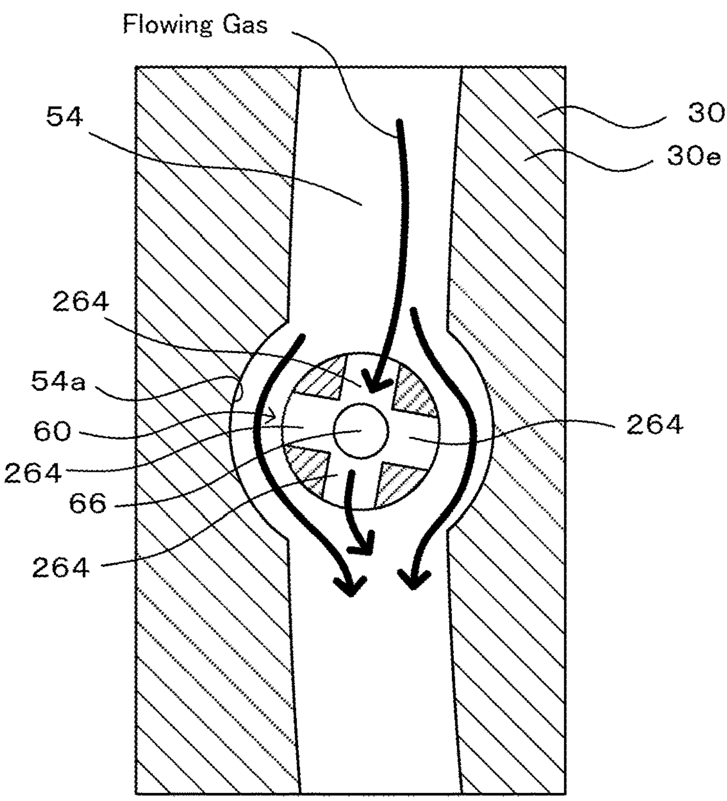
FIG. 10 is an explanatory view of the insulating sleeve 60 including a first communication hole 264.
Figure 11:
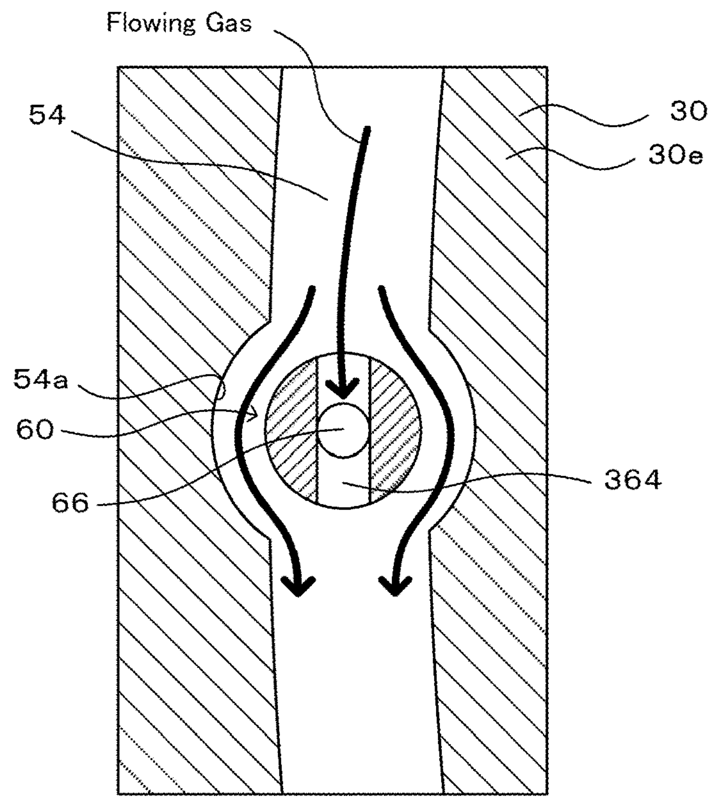
FIG. 11 is an explanatory view of the insulating sleeve 60 including a first communication hole 364.

In the above-described embodiment, the first communication hole 64 of the insulating sleeve 60 is provided radially in three directions around the second communication hole 66 in a plan view; however, the first communication hole 64 may be provided radially in four or more directions. FIG. 10 is an explanatory view of an example in which a first communication hole 264 is provided radially in four directions around the second communication hole 66 in a plan view. Here, four first communication holes 264 are formed at every equal angle (or substantially equal angle). Even in this configuration, the direction of the first communication hole 64 does not need to be considered when the insulating sleeve 60 is attached to the base plate through-hole 31. Alternatively, as illustrated in FIG. 11, a linear first communication hole 364 crossing the second communication hole 66 in a plan view may be provided. In that situation, when the insulating sleeve 60 is attached to the base plate through-hole 31, work needs to be performed so that the direction of the linear first communication hole 364 is aligned to the direction of the gas common passage 54. Note that in FIG. 10 and FIG. 11, the same components as in the above-described embodiment are labeled with the same symbol.

Figure 12:
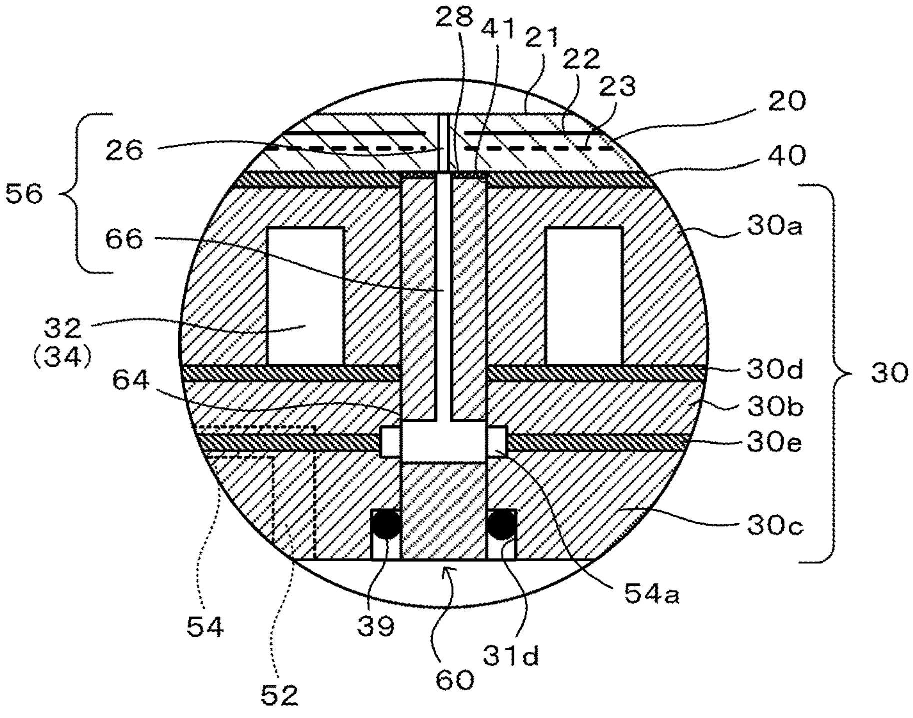
FIG. 12 is an explanatory view of an example in which a seal ring 39 is disposed in a lower portion of the insulating sleeve 60.

In the above-described embodiment, the lower portion of the insulating sleeve 60 is adhered and sealed to the large diameter section 31*d* of the base plate through-hole 31 by the resin adhesive layer 38; however, the invention is not particularly limited to this. For example, as illustrated in FIG. 12, a seal ring 39 may be disposed between the insulating sleeve 60 and the large diameter section 31*d* of the base plate through-hole 31 to prevent gas from leaking to the outside from the outer periphery of the insulating sleeve 60. The seal ring 39 may be made of metal, or made of resin. Note that in FIG. 12, the same components as in the above-described embodiment are labeled with the same symbol.

Figure 13:
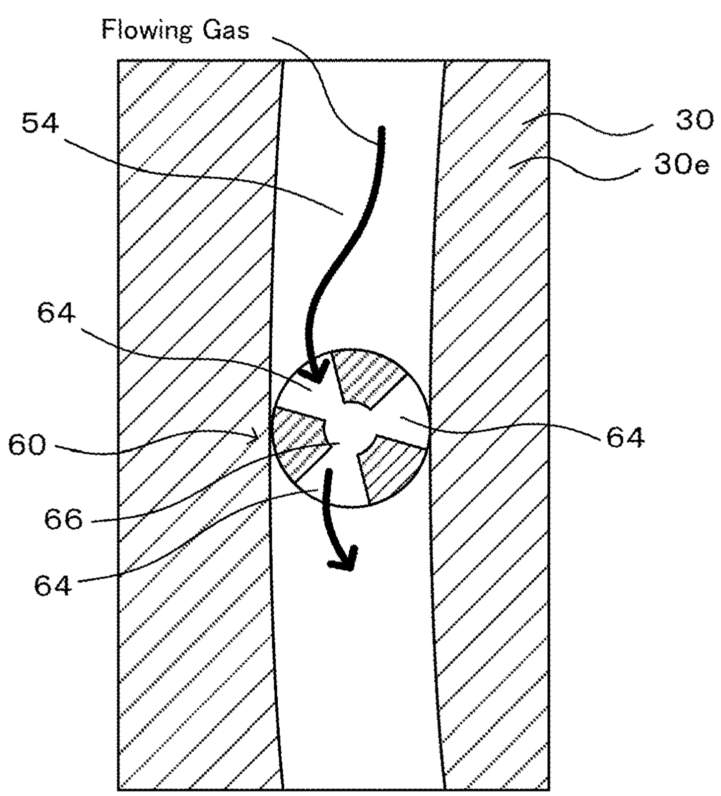
FIG. 13 is an explanatory view of an example in which the outer diameter of the insulating sleeve 60 is substantially equal to the width of the gas common passage 54.

In the above-described embodiment, space where gas can pass is formed between the sleeve insertion section 54*a* of the gas common passage 54 and the insulating sleeve 60; however, the invention is not particularly limited to this. For example, no sleeve insertion section 54*a* may be formed in the gas common passage 54, and the outer diameter of the insulating sleeve 60 may be smaller than the width of the gas common passage 54. Even in this configuration, the same operational effect as in the above-described embodiment is achieved. Alternatively, as illustrated in FIG. 13, the arcuately expanded sleeve insertion section 54*a* may not be used, and the outer diameter of the insulating sleeve 60 may be made equal (or substantially equal) to the width of the gas common passage 54. Note that in FIG. 13, the same components as in the above-described embodiment are labeled with the same symbol. In this situation, gas cannot move downstream of the gas common passage 54 through the outside of the insulating sleeve 60; however, except for this point, the same operational effect as in the above-described embodiment is achieved.

In the above-described embodiment, the number of at least one gas inlet passage 52 is one for each gas common passage 54, however, may be a number less than the number of gas outlet passages 56 provided in the gas common passage 54.

In the above-described embodiment, the gas common passage 54 has a C-shape in a plan view; however, the invention is not particularly limited to this. For example, the gas common passage 54 may have a spiral shape in a plan view. Alternatively, multiple C-shaped gas common passages 54 may be provided along multiple concentric circles in a plan view.

In the above-described embodiment, the ceramic plate 20 incorporates electrostatic electrode 22 and heater electrode 23; however, the invention is not particularly limited to this. For example, only one of the electrostatic electrode 22 and the heater electrode 23 may be incorporated in the ceramic plate 20. Alternatively, heater electrode 23 may be provided so as to be incorporated in two or more stages in a thickness direction.

In the above-described embodiment, a lift pin hole penetrating the wafer placement table 10 may be provided. The lift pin hole is a hole to insert a lift pin for lifting and lowering the wafer W in up-down direction relative to the wafer placement surface 21. For example, when the wafer W is supported by three lift pins, the lift pin hole is provided at each of three sites.

In the above-described embodiment, the ceramic plate 20 is produced by hot-press firing a molded body of ceramic powder; however, the molded body may be produced by layering multiple tape molded bodies, or produced by a mold cast method, or produced by compacting ceramic powder.

International Application No. PCT/JP2022/026286, filed on Jun. 30, 2022, is incorporated herein by reference in its entirety.

What is claimed is:

1. A member for semiconductor manufacturing apparatus, comprising:

- a ceramic plate having a wafer placement surface at an upper surface and incorporating an electrode;
- a conductive base plate provided on a lower surface side of the ceramic plate;
- a gas common passage provided inside the base plate;

gas outlet passages provided for the gas common passage to reach the wafer placement surface from the gas common passage;

at least one gas inlet passage provided for the gas common passage and provided so as to communicate with the gas common passage from a lower surface of the base plate, the number of the at least one gas inlet passage being less than the number of the gas outlet passages; and an insulating sleeve disposed in a base plate through-hole which penetrates the base plate in up-down direction, wherein the insulating sleeve has a first communication hole that constitutes part of the gas common passage, and a second communication hole that is provided to reach an upper surface of the insulating sleeve from the first communication hole, and constitutes part of the gas outlet passages, and wherein the at least one gas inlet passage is connected to at least one end of the gas common passage, and wherein the gas common passage is c-shaped or spiral shaped in plan view.

2. The member for semiconductor manufacturing apparatus according to claim 1, wherein the insulating sleeve is one member which is unable to be disassembled.

3. The member for semiconductor manufacturing apparatus according to claim 1, wherein the first communication hole of the insulating sleeve is provided radially in at least three directions around the second communication hole in a plan view.

4. The member for semiconductor manufacturing apparatus according to claim 1, wherein an outer diameter of the insulating sleeve is smaller than a width of the gas common passage.

5. The member for semiconductor manufacturing apparatus according to claim 1, wherein the ceramic plate and the base plate are bonded by a conductive bonding layer, and the insulating sleeve is inserted in the conductive bonding layer.

6. The member for semiconductor manufacturing apparatus according to claim 1, wherein an upper surface of the insulating sleeve is adhered to the ceramic plate with an upper resin adhesive layer interposed between the upper surface and the ceramic plate, and a lower portion of the insulating sleeve is adhered to the base plate with a lower resin adhesive layer or a seal material interposed between the lower portion and the base plate.

* * * * *